United States Patent [19]
Ohmi et al.

[11] Patent Number: 5,854,097
[45] Date of Patent: Dec. 29, 1998

[54] METHOD OF MANUFACTURING A SEMICONDUCTOR DEVICE

[75] Inventors: Tadahiro Ohmi; Mamoru Miyawaki, both of Sendai, Japan

[73] Assignee: Canon Kabushiki Kaisha, Tokyo, Japan

[21] Appl. No.: 440,917

[22] Filed: May 15, 1995

Related U.S. Application Data

[62] Division of Ser. No. 304,219, Sep. 12, 1994, Pat. No. 5,541,444, which is a continuation of Ser. No. 678,325, Mar. 19, 1992, abandoned.

[30] Foreign Application Priority Data

Sep. 9, 1989 [JP] Japan .................................. 1-233929

[51] Int. Cl.$^6$ .................................................. H01L 21/338
[52] U.S. Cl. ........................ 438/182; 438/183; 438/309; 438/926; 438/951; 148/DIG. 100
[58] Field of Search .................... 438/182, 309, 438/183, 926, 951, 165, 185, 193, 197, 198, 346, 347, 423, 455; 148/DIG. 100

[56] References Cited

U.S. PATENT DOCUMENTS

| | | | |
|---|---|---|---|
| 4,324,038 | 4/1982 | Chang et al. | 29/571 |
| 4,334,349 | 6/1982 | Aoyama et al. | 437/187 |
| 4,337,115 | 6/1982 | Ikeda et al. | 437/187 |
| 4,343,080 | 8/1982 | Hataishi et al. | 437/31 |
| 4,356,210 | 10/1982 | Imai et al. | 427/38 |
| 4,532,002 | 7/1985 | White | 437/187 |
| 5,077,227 | 12/1991 | Kameyama et al. | 437/31 |
| 5,096,842 | 3/1992 | Nihira et al. | 437/31 |
| 5,198,372 | 3/1993 | Verret | 437/31 |

FOREIGN PATENT DOCUMENTS

| | | |
|---|---|---|
| 0083785 | 7/1983 | European Pat. Off. . |
| 0263220 | 4/1988 | European Pat. Off. . |
| 0286117 | 10/1988 | European Pat. Off. . |
| 0035475 | 4/1978 | Japan .................................. 437/187 |
| 57-207374 | 12/1982 | Japan . |
| 0025229 | 2/1983 | Japan .................................. 437/187 |
| 0055015 | 3/1984 | Japan .................................. 437/187 |
| 60-198863 | 10/1985 | Japan . |
| 0202427 | 9/1986 | Japan .................................. 437/187 |
| 0092327 | 4/1987 | Japan .................................. 437/912 |
| 62-79666 | 4/1987 | Japan . |
| 0213140 | 9/1987 | Japan .................................. 437/187 |
| 0177523 | 7/1988 | Japan .................................. 437/187 |
| 64-002362 | 1/1989 | Japan . |
| 5175204 | 7/1993 | Japan .................................. 437/31 |

OTHER PUBLICATIONS

Werner et al., "Modern Bipolar Technology for Gate Array and Memory Applications", Siemans Research and Development Reports, vol. 17, No. 5, 1988, pp. 221–226.

*Primary Examiner*—Jey Tsai
*Assistant Examiner*—Long Pham
*Attorney, Agent, or Firm*—Fitzpatrick, Cella, Harper & Scinto

[57] ABSTRACT

A device having, at least, a first film having a surface on which neither a natural oxide film nor impurity grains caused by a resist residue is or are present, and a conductive material layer formed on a surface adjacent to the surface of the first film, wherein an insulative compound film is formed on a surface of the conductive material layer by a surface reaction with the conductive material layer, and a predetermined second film required for an arrangement is formed on the surface of the first film.

25 Claims, 16 Drawing Sheets

☒ BURIED METAL FOR BASE

▨ METAL FOR WIRING ON INSULATING LAYER AT INTER-LAYER

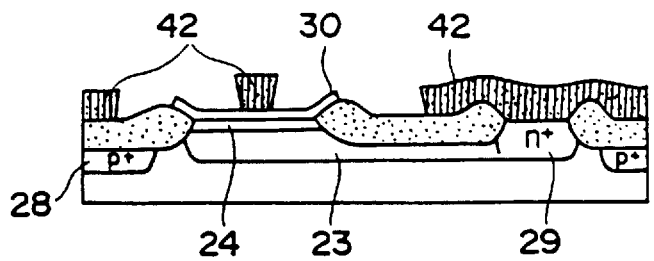
Fig. 8(f')
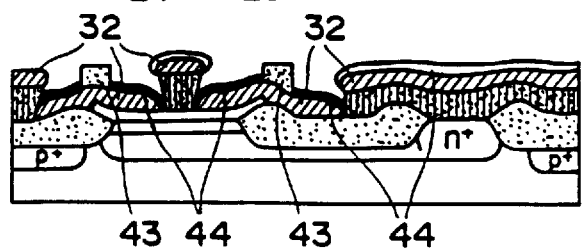
Fig. 8(g')
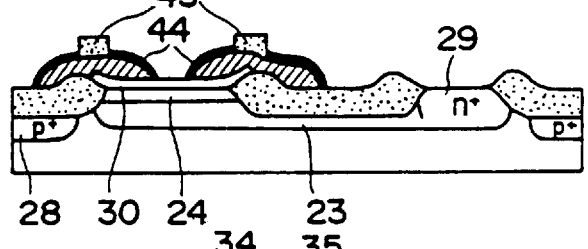
Fig. 8(h')
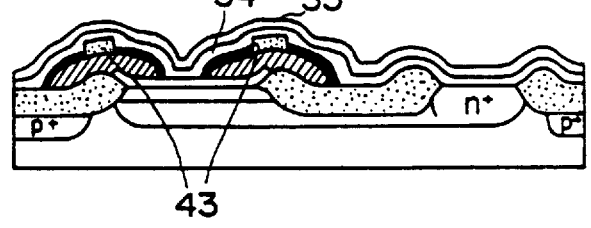
Fig. 8(i')
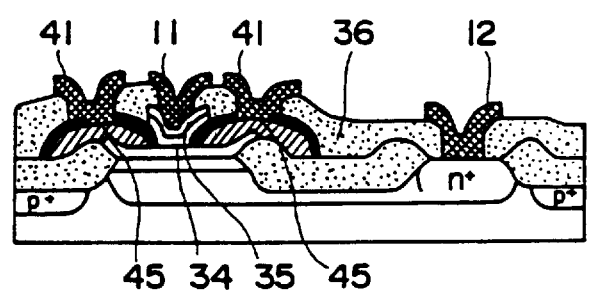
Fig. 8(j')

Fig. 14b1) 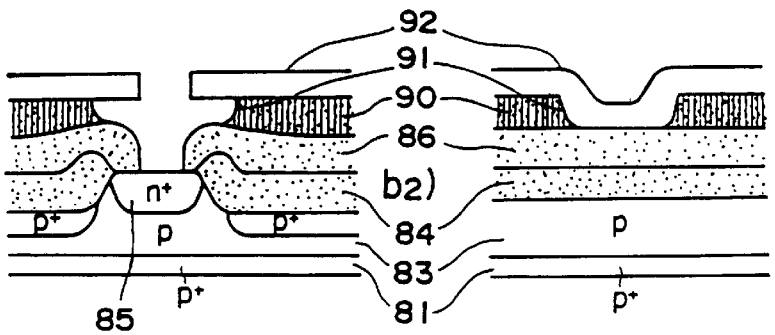
Fig. 14c1) 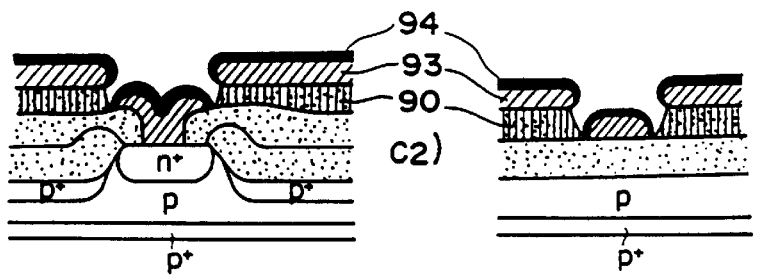
(CONTACT HOLE AREA)   (WIRING AREA)

METHOD OF MANUFACTURING A SEMICONDUCTOR DEVICE

This application is a division of application Ser. No. 08/304,219 filed Sep. 12, 1994, now U.S. Pat. No. 5,541,444 which was a continuation of application Ser. No. 07/678,325 filed Mar. 19, 1992, now abandoned.

TECHNICAL FIELD

The present invention relates to a device and a method of manufacturing the same, and a semiconductor device and a method of manufacturing the same.

BACKGROUND ART

Problems of conventional semiconductor integrated circuits will be described below by taking the following three arrangements as examples.

The first example is a bipolar transistor. An ECL (Emitter Coupled Logic) circuit is available as the most typical circuit using a bipolar transistor, and its switching time $t_{pd}$ is represented by the following relation:

$$t_{pd} \propto r_{bb'}[AC_{TC1}+C_{d1}]+V_S \cdot (C_{TS1}+C_{de1})/I_{CS}$$

where $r_{bb'}$: the base resistance of an input transistor

A: the voltage amplification factor of a current switching circuit $V_S$: the logic amplitude voltage $C_{TC1}$: the base-collector junction capacitance of the input transistor $C_{d1}$: the diffusion capacitance and the emitter-base junction capacitance of the input transistor $I_{CS}$: the current amount of the input transistor $C_{TS1}$: the collector-side parasitic capacitance of the input transistor $C_{de1}$: the diffusion capacitance of an output emitter-follower transistor.

As is apparent from the above relation, in case of a low-current region, i.e., a region of small $I_{CS}$ for the ECL circuit, a delay time is determined by a collector response time in the second term of relation (1). On the other hand, a base response time in the first term in the relation becomes dominant in a region where $I_{CS}$ is large. That is, reduction in $r_{bb'}$ and $C_{TC}$ and that in the diffusion capacitance, i.e., an improvement in an $f_T$ value is an important factor of increasing an operation speed.

To realize a high operation speed, a transistor using an SST (Super-Self-aligned process Technology) as shown in FIG. 15 is currently proposed. Referring to FIG. 15, reference numeral 201 denotes a p-type semiconductor substrate; 202, a p⁺-type semiconductor isolation region for isolating adjacent elements; 203, an n⁺-type buried layer (n⁺-BL); 204, an n-type epitaxial layer; 205, a field oxide layer; 206, an Si₃N₄ film; 207, a p-type base region; 208, a p⁺-type polycrystalline Si base electrode; 209, an n⁺-type emitter region; 210, an n⁺-type polycrystalline Si emitter electrode; and 211, 212, and 213, base, emitter, and collector electrodes, respectively, each consisting of a metal.

FIG. 16 shows the emitter and base regions of this conventional example in an enlarged scale. As is apparent from FIG. 16, since the p⁺-type polycrystalline Si base electrode 208 for a base contact is formed close to the emitter region 209, an external base current is reduced.

The above conventional example, however, has the following problems.

(1-1) A natural oxide film 214 is present in the interface between the n⁺-type polycrystalline Si layer 210 and the p-type base region 207 of the single-crystal epitaxial layer 204 to cause a variation in bipolar characteristics (especially, an emitter ground current amplification factor).

The emitter region 209 in this structure is normally called a DOPOS (Doped Poly Silicon) emitter which is formed by doping an impurity in the n⁺-type poly silicon layer 210 into the portion 209 of the epitaxial layer by thermal diffusion. However, since a wafer must be temporarily exposed to the outer air before formation of the n⁺-type poly Si layer 210 on the p-type base region 207, the natural oxide film 214 is formed on the p-type base region 207. The natural oxide film 214 is nonuniform because the process control is impossible. As a result, the diffusion of the impurity into the p-type base region 207 becomes nonuniform.

To settle the matter radically, therefore, a process not forming any natural oxide film must be adopted. In the current circumstances, however, since a contact hole patterning step for the emitter region 209 is necessary before formation of the n⁺-type poly Si layer 210, the upper surface of the p-type base region 207 of the epitaxial layer 204 is inevitably exposed to the outer air and a natural oxide film is formed on the surface.

(1-2) When the contact hole formation step (hole formation) for forming the emitter region 209 is performed by dry etching, the base region 207 present below the emitter region 209 is damaged.

Although wet etching may be performed as etching free from a damage, since the size of a contact hole is inevitably increased when the wet etching is used, no micropatterned emitter region can be formed. Although a dry etching method causing no damage has been developed, the method is currently still unsatisfactory.

(1-3) A base resistance is still high to interfere with a high-speed operation.

That is, although an external base resistance is reduced in the bipolar transistor using the SST described above as compared with conventional transistors, it is still high because poly Si is used as the material of the base electrode 208.

Problems of a MOSFET will be described below.

(2-1) Degradation in a drain current $I_D$ and $g_m$ ($\equiv \partial I_D/\partial I_G$) becomes significant due to a parasitic resistance as the degree of micropatterning is increased.

FIG. 17 shows calculated values and measured values in a relationship between an effective channel length (abscissa) and a drain current (ordinate) obtained in an LDD (Lightly Doped Drain) structure which is used most often among conventional micropatterned MOSFETs. The calculation is performed using an equivalent circuit model formed in consideration of a parasitic resistance and speed saturation. As is apparent from FIG. 17, as the effective channel length approaches 0.2 μm, the parasitic resistance is increased, and current reduction in a nonsaturated region becomes significant.

(2-2) In a conventional MOSFET structure in which a source.drain region is formed by a diffusion layer, a channel length is significantly decreased in a micropatterned region.

FIG. 18 shows a change in threshold voltage (ordinate) as a function of a channel length L (abscissa) using a depth $X_j$ of a source.drain diffusion layer as a parameter. As shown in FIG. 18, in an ordinary MOSFET, reduction in threshold value becomes significant because the channel length is decreased when the depth $X_j$ is large. However, since a source.drain diffusion layer of a conventional MOSFET is formed by ion implantation using a gate as a mask, the minimum value of $X_j$ is at most about 0.1 μm, and it is difficult to form a source.drain portion having a depth smaller than this value.

(2-3) Selection of a gate material is considerably limited.

In a conventional MOSFET, a source.drain diffusion layer is formed by ion implantation using a gate as a mask. Therefore, a gate material is required to satisfy the following conditions.

(1) The gate material must have an ion-implantation resistance.

(2) Since a heat treatment is performed at a temperature of 550° C. or more to activate the source.drain formed by ion implantation, the material must withstand a temperature of 550° C. or more.

(3) The gate material must allow formation of an insulating layer around the gate portion in order to prevent a leakage current between the gate and the source.drain.

(4) The gate material must have a low resistance to realize a high-speed operation.

(5) The gate material must have a predetermined work function to suppress reduction in threshold value caused by a short channel length. If Al, for example, is used as the gate material to achieve a low resistance, the problem of heat resistance described in item (2) above is satisfied.

Lastly, problems in conventional wiring will be described below. FIG. 19 is a view showing conventional wiring steps, in which reference numeral 215 denotes a substrate or a wafer layer, e.g., a p-type semiconductor layer. Reference numeral 216 denotes a field oxide film; 217, a diffusion layer for contact with respect to wiring, which is an $n^+$-type semiconductor layer in this example; 218, an insulating layer such as $SiO_2$ formed by a CVD apparatus; 219, a wiring metal; and 220, a resist for patterning the wiring metal 219. FIG. 19(a) is a view showing a step in which resist patterning is finished. The resultant wafer is conveyed into an RIE (Reactive Ion Etching) apparatus, and its metal wiring is etched as shown in FIG. 19(b). Referring to FIG. 19(b), reference numeral 222 denotes an etching residue of the wiring metal. The etching residues 222 are produced because a metal enters microspaces on the surface of the insulating layer 218 or the resist 220 is scattered in an RIE atmosphere when the wafer is exposed to the atmosphere and the scattered resist components adhere on the metal surface to form masks. These residual metal components cause a leakage current.

FIG. 19(c) shows a step of removing the resist obtained by patterning the wiring metal after the etching. As shown in FIG. 19(c), removal of the resist and washing are generally performed using an organic substance such as trichloroethylene. However, residues 223 of the resist are produced in such a method. Although a method (so-called $O_2$ ashing) of leaving a wafer to stand in an oxygen plasma to remove a resist may be used, a damage is produced because the wafer is left to stand in the plasma.

As described above, the conventional wiring steps have the following problems.

(3-1) A wiring metal remains at a microlevel on the surface of an insulating layer, and a leakage current is flowed through this residual metal.

(3-2) A resist used in patterning of wiring is not perfectly removed, and an organic impurity remains on a wafer.

(3-3) When $O_2$ ashing is performed in resist removal, a damage caused by a plasma is produced inside a wafer.

As a result, in conventional techniques, even if attempts are made to keep clean surface conditions on various film surfaces (e.g., a semiconductor surface and an insulating layer surface) having important effects on device characteristics, mixing of an impurity caused by a natural oxide film or a resist residue cannot be prevented. Therefore, there exists no device in which neither a natural oxide film nor an impurity remains on the surface of each film surface.

Disclosure of Invention

In order to solve the above problems, the aspects of the present invention are constituted as follows.

The first aspect of the present invention lies in a device comprising, at least, a first film having a surface on which neither a natural oxide film nor impurity grains caused by a resist residue is or are present, and a conductive material layer formed on a surface adjacent to the surface of the first film, wherein an insulative compound film is formed on a surface of the conductive material layer by a surface reaction with the conductive material layer, and a predetermined second film required for an arrangement is formed on the surface of the first film.

The second aspect of the present invention lies in a method of manufacturing a device, comprising the steps of forming an insulating film, which can be selectively dry-etched with respect to an insulative compound to be subsequently formed, on a surface of a first film, exposing at least a portion of a side portion of the insulating film to form a conductive material layer on a surface adjacent to the surface of the first film, forming an insulative compound film on a surface of the conductive material layer by a surface reaction with the conductive material layer, and dry-etching the insulating film to expose the surface of the first film, and forming a second film required for a device arrangement on the surface of the first film.

The third aspect of the present invention lies in a semiconductor device, wherein, in a bipolar transistor, a conductive material is formed on a base region, and an insulative compound containing the conductive material is formed on a surface of the conductive material opposite to the base region.

The fourth aspect of the present invention lies in a semiconductor device, wherein, in a bipolar transistor, a conductive material is formed on a base region, and an insulative compound containing the conductive material is formed on a portion of a surface of the conductive material on a side opposite to the base region and connected to base wiring in a region where the insulative compound is not formed.

The fifth aspect of the present invention lies in a method of manufacturing a bipolar transistor in which a conductive material is formed on a base region, an insulative compound containing the conductive material is formed on a surface of the conductive material on a side opposite to the base region, and an emitter thin film is formed in contact with the base region and the insulative compound, wherein an $SiO_2$ layer is formed on a prospective emitter formation region, and then film formation of the conductive material, formation of an insulating layer on a surface of the conductive material, removal of the $SiO_2$ layer, and formation of the emitter thin film are all performed in an apparatus without exposing a wafer to the outer air.

The sixth aspect of the present invention lies in a method of manufacturing a bipolar transistor in which a conductive material is formed on a base region, an insulative compound containing the conductive material is formed on a portion of a surface of the conductive material on a side opposite to the base region and connected to base wiring in a region where the insulative compound is not formed, and an emitter thin film is formed in contact with the base region and the insulative compound, wherein an $SiO_2$ layer doped with an impurity is formed in a prospective emitter formation region, and then film formation of the conductive material, formation of a non-impurity-doped $SiO_2$ layer on a portion of the conductive material, formation of an insulating layer on a surface of the conductive material, removal of only the impurity-doped $SiO_2$ layer, and formation of the emitter thin film are performed.

The seventh aspect of the present invention lies in a semiconductor device, wherein, in a MOSFET, an interface between a gate oxide film and a semiconductor substrate or a semiconductor wafer layer formed on the substrate and an interface between source and drain regions and the semiconductor substrate or the wafer layer are present in the same plane, a conductive material is formed on the source and drain regions, and the conductive material and a gate electrode are isolated from each other by an insulative compound formed on a surface of the conductive material and containing the conductive material.

The eighth aspect of the present invention lies in, in a method of manufacturing a MOSFET in which an interface between a semiconductor substrate or a semiconductor wafer layer formed on an arbitrarily substrate and a gate oxide film and an interface between source and drain regions and the semiconductor substrate or the wafer layer are present on the same plane, a conductive material is present on the source and drain regions, the conductive material and a gate electrode are isolated from each other by an insulative compound formed on a surface of the conductive material and containing the conductive material, and source and drain wiring electrodes are connected to the surface of the conductive material through a region where the insulative compound is not formed, a method of manufacturing a semiconductor device wherein a pattern is formed such that an impurity-doped $SiO_2$ layer is removed from only prospective source and drain formation regions, and then film formation of source and drain semiconductors, film formation of the conductive material, formation of a non-impurity-doped $SiO_2$ layer on a portion of the conductive material, formation of an insulating layer on the surface of the conductive material, removal of only the impurity-doped $SiO_2$ layer, and formation of an insulating interlayer and contact holes and formation of source, gate, and drain electrodes are performed.

The ninth aspect of the present invention lies in a semiconductor device, wherein an insulative compound film containing a conductive material for constituting a wiring member is formed on a surface of the wiring member on a semiconductor layer.

The tenth aspect of the present invention lies in a method of manufacturing a semiconductor device, in which an insulative compound film containing a conductive material for constituting a wiring member is formed on a surface of the wiring member, wherein formation of an impurity-doped $SiO_2$ film on an insulating interlayer, formation of a resist pattern of wiring, etching of the impurity-doped $SiO_2$ using the resist pattern, formation of a resist pattern of contact holes, dry etching of the insulating interlayer, film formation of the conductive material for constituting the wiring member, formation of the insulative compound film on the surface of the wiring member, and removal of the impurity-doped $SiO_2$ layer are performed.

Operation

The operation of the present invention together with a more detailed structure of the present invention will be described as below.

The present invention will be described with reference to the accompanying drawings.

In an arrangement shown in FIG. 1, a device is a bipolar transistor in which the first film is a base layer 7. In FIG. 9 showing an arrangement in which a device is a MOSFET, the first film is a gate insulating film 59. In FIG. 13 showing a semiconductor device as an example of a device having wiring, the first film is an insulating interlayer 86.

In the present invention, an insulating film (31, 66, and 90 shown in FIGS. 4, 10, and 14, respectively) on the surface of the first film.

This insulating film consists of an insulating material which can be selectively dry-etched with respect to an insulative compound to be formed later. For example, $SiO_2$ formed by a chemical vapor deposition method or a material obtained by doping an impurity in this $SiO_2$ may be used.

Subsequently, in the present invention, a conductive material layer is formed on a surface adjacent to the surface of the first film. In the arrangement shown in FIG. 4, the surface adjacent to the surface of the first film is a surface except for the surface of a source layer 30 on which an insulating film 31 is formed. In the arrangement shown in FIG. 10, the surface is the surfaces of source and drain regions 55 and 56. In the arrangement shown in FIG. 13, the surface extends from the surface of an $n^+$-type layer 41 to the exposed surface of the insulating interlayer 86.

The type of the conductive material is not particularly limited as long as the material has conductivity and can form an insulative compound on the surface by a surface reaction. For example, a material capable of reacting with $O_2$ or $F_2$ gas to form an insulative compound on the surface can be used. Examples of the material are a metal, an alloy, and a superconducting material.

The present invention has one feature in the formation of this conductive material layer. That is, the feature of the present invention is that at least a portion of a side portion of the insulating film is exposed to form the conductive material layer. To form the conductive material layer in this manner, the insulating film may be formed to have an inversely tapered shape. Alternatively, the film formation conditions during the formation of the insulating film, particularly, the wafer temperature and the bias voltage may be controlled to decrease the migration of conductive material grains. In this case, the "migration" means surface diffusion of the conductive material grains. That is, the migration is the degree of diffusion of the conductive material grains on the surface.

After the formation of the conductive material layer, an arbitrary gas is used to form an insulative compound film of the conductive material on the surface of the conductive material layer. Examples of the gas are $O_2$ and $F_2$ gases.

After the formation of the insulative compound film, an arbitrary dry gas is used to perform dry etching for the insulating film. Examples of the dry gas are HF gas and HF gas diluted by $N_2$ gas. The gas does not etch the insulative compound film formed on the conductive material layer surface but selectively etches only the insulating film. Since the side surfaces of the insulating film are exposed, the insulating film and the conductive material deposited on the insulating film are removed, and the surface of the first film is exposed because, e.g., a contact hole is formed on the surface of the first film.

That is, since the conductive material and the insulative compound film formed on the surfaces of the conductive material play a role as a mask, the second film necessary for a device configuration can be formed on only the surface of the first film.

Since the present invention adopts the above arrangement, a surface on which the second film is to be formed is covered until the second film is formed. Therefore, no natural oxide film or the like is formed on the prospective formation surface of the second film.

In addition, since the contact hole can be formed without using any resist, mixing of an impurity caused by a resist residue can be prevented.

Furthermore, since the formation of the contact hole can be performed without using, e.g., the RIE method, a damage to the prospective formation surface of the second film caused by the RIE can be prevented.

Moreover, since the conductive material layer plays a role as a mask in the formation of the second film, a self-alignment is enabled to realize formation of a micropatterned device.

BRIEF DESCRIPTION OF DRAWINGS

FIG. 8 is a view showing manufacturing steps of the bipolar transistor according to the fourth embodiment of the present invention.

denotes substrate; 2 denotes element isolation diffusion layer; 3 denotes buried layer; 4 denotes epitaxial layer; 5, 54, 84 denote field oxide films; 7 denotes base thin film; 8 denotes buried base electrode; 14, 88, 60 denote insulating layers; 15 denotes n-type semiconductor; 16 denotes wide-gap $n^+$-type semiconductor; 11 denotes emitter electrode; 12 denotes collector electrode; 13, 89 denote passivation films; 51 denotes buried layer; 52 denotes channel stopper layer; 53, 83 denote well layer; 55 denotes source layer; 56 denotes drain layer; 59 denotes gate oxide film; 62 denotes source electrode; 63 denotes drain electrode; and 64 denotes gate electrode.

Embodiments of the present invention will be described in detail below.

(1st Embodiment)

Figure 1:
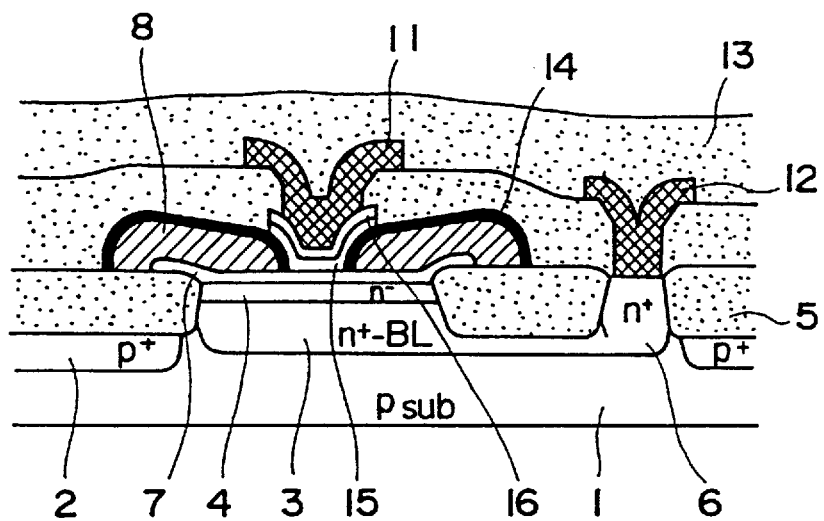
FIG. 1 is a sectional view showing a bipolar transistor according to the first embodiment of the present invention.

FIG. 1 shows a sectional structure of a bipolar transistor according to the first embodiment of the present invention.

Referring to FIG. 1, reference numeral 1 denotes a p-type Si substrate; 2, an element isolation $p^+$-type semiconductor layer; 3, an $n^+$-type semiconductor buried layer for obtaining a collector potential; 8, a conductive material (a buried metal for a base electrode) such as Al or Cu; 5, a field oxide film; 4, an n-type epitaxial layer; 7, a base layer consisting of a $p^+$-type semiconductor; 14, an insulating layer formed on the surface of the base electrode buried metal 8; 6, an $n^+$-type semiconductor layer for connecting a collector electrode 12 and the $n^+$-type semiconductor buried layer 3; 15, an n-type Si layer for forming an emitter region; 16, an $n^+$-type semiconductor thin film having a band gap wider than that of Si and consisting of, e.g., a single-crystal material or a polycrystalline material of $Si_xC_{1-x}Ge_y$ (0<x<1 and 0<y<1), a polycrystalline $Si_xC_{1-x}$:H material, a micro-crystal $Si_xC_{1-x}$:H material, and a micro-crystal Si:H material; 11 and 12, emitter and collector wiring metals; and 13, a passivation film consisting of, e.g., $Si_3N_4$.

Figure 2:
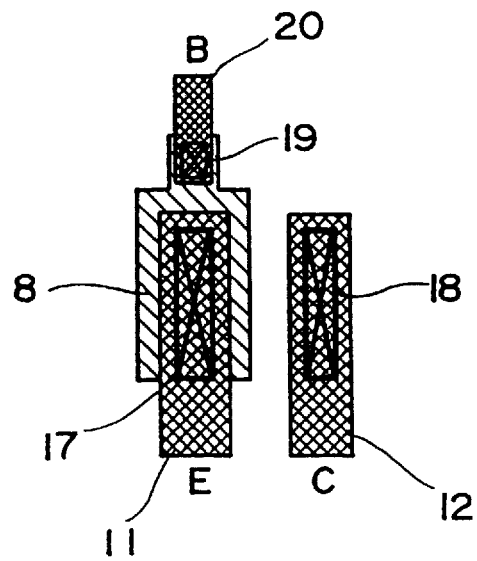
FIG. 2 is a plan view showing the bipolar transistor according to the first embodiment of the present invention.
Figure 3:
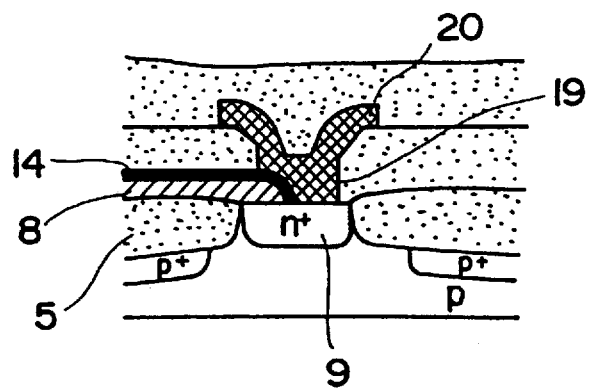
FIG. 3 is a sectional view showing a connection portion between a base electrode and wiring of the bipolar transistor according to the first embodiment of the present invention.

Although the base electrode 8 is kept buried in FIG. 1, it can be caused to contact the wiring metal on the insulating interlayer in a region separated from the peripheral portion of the emitter region 15, as shown in FIG. 2. Referring to FIG. 2, reference numeral 17 denotes an emitter contact hole; 18, a collector contact hole; 19, a through hole for connecting the base buried metal 8 with the wiring metal on the insulating interlayer; and 20, base electrode wiring on the insulating interlayer. FIG. 3 is a sectional view showing a portion around the through hole 19. As is apparent from FIG. 3, since the upper surface (a surface opposite to the base region 7, i.e., a surface on the opposite side) of the base buried electrode 8 is covered with the insulating layer 14, the electrode 8 is in contact with the upper electrode 20 through the semiconductor heavily doped impurity diffusion layer ($n^+$-type diffusion layer) 9. The base buried electrode 8 is formed on the field oxide film 5 and therefore does not particularly lead to an increase in parasitic capacitance in a base-to-collector path.

The characteristics of the bipolar transistor of the first embodiment are as follows.

(1) Since the base wiring consists of a conductive material and the emitter region is formed through a thin insulating layer formed on the surface of the base wiring, an external base resistance is reduced to its limit to improve frequency characteristics.

(2) As shown in FIG. 2, since no contact hole for a base electrode need be formed around the emitter, the device size can be decreased.

(3) An emitter.base junction has a flat surface, and a junction capacitance in an emitter-to-base path is small.

(4) Since a transistor is manufactured by a manufacturing method (to be described below) on the interface on which an emitter thin film is formed, no natural oxide film is present.

A method of manufacturing the bipolar transistor according to the first embodiment of the present invention will be described below with reference to FIG. 4.

Figure 4A:
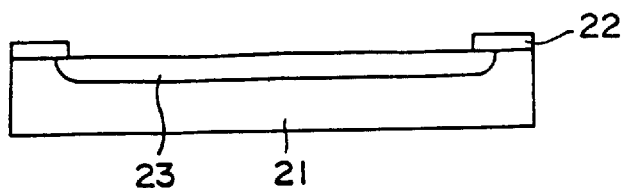
FIG. 4 is a view showing manufacturing steps of the bipolar transistor according to the first embodiment of the present invention.

A p-type high-resistance substrate is used as an Si substrate 21 shown in FIG. 4(a). First, the surface of the Si substrate 21 is oxidized to form an $SiO_2$ film, and a photoresist process is performed. Subsequently, as shown in FIG. 4(a), the $SiO_2$ film 22 is selectively etched, and an n-type impurity is diffused at a high concentration into a predetermined position of the Si substrate 21 to form a collector buried layer ($n^+$-BL) 23.

Sb or the like having a small diffusion constant can be preferably used as the impurity to be doped in the collector buried layer 23 in order to minimize spreading of the impurity caused when a heat-treatment (to be described later) is performed. Alternatively, since Sb has a low solid solubility, As or the like may be used as the impurity to be doped in order to decrease the resistance of the collector buried layer 23. In this case, to prevent re-distribution of As, the temperature of a heat treatment may be decreased or auto doping may be prevented in epitaxial growth.

Figure 4B:
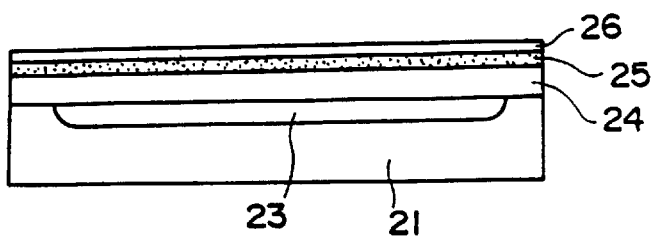
Figure 4C:
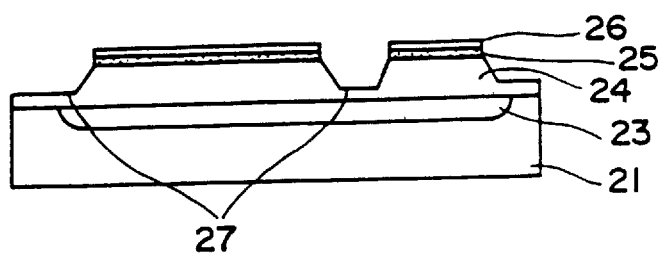

Subsequently, epitaxial growth is performed on the collector buried layer 23 to form an n-type single-crystal layer 24 (FIG. 4(b)) to have a thickness of about 1.0 to 0.8 μm. The impurity concentration of the single-crystal layer 24 is $10^{15}$ to $10^{17}$ /cm$^3$. After the epitaxial growth, as shown in FIG. 4(b), the surface of the single-crystal layer 24 is oxidized to form a thin oxide film (oxide $SiO_2$ film) 25, and an $Si_3N_4$ film 26 serving as a mask for selective oxidation is formed by a CVD method.

Subsequently, a photoresist process for forming an isolation pattern (an isolation oxide film 25b shown in FIG. 4(d)) is performed to etch the $Si_3N_4$ film 26 and the $SiO_2$ film 25, and etching of the n-type single-crystal layer (epitaxial growth layer 24) is performed. As indicated by reference numeral 27 in FIG. 4(c), the etching of the n-type single-crystal layer 24 is performed to the middle portion of the epitaxial layer 24 so that the bottom surface (25c in FIG. 4(d)) of the isolation oxide film 25b (to be formed later) is formed to be in contact with the collector buried layer 23.

Figure 4D:
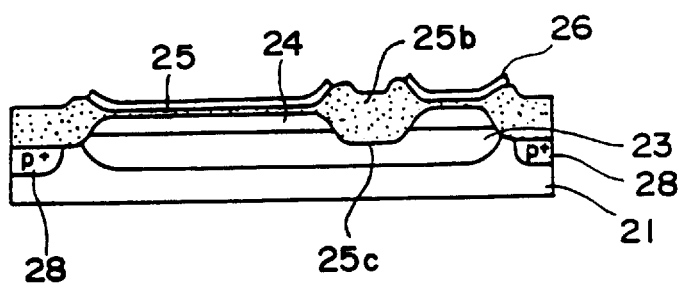

Thereafter, $B^+$ ion implantation is performed in a region indicated by reference numeral 28 in FIG. 4(d) to form an element isolation region 28 for ensuring isolation. After the ion implantation, an annealing is performed to prevent production of defects, and selective oxidation is performed at a temperature of 900° C. to 1,050° C. to form the isolation oxide film 25b, as shown in FIG. 4(d). Since the temperature of the selective oxidation is as high as 900° C. to 1,050° C., it is preferred to shorten the oxidation time using a high-pressure oxidation method so that the impurity doped in the collector buried layer 23 does not cause re-distribution.

Figure 4E:
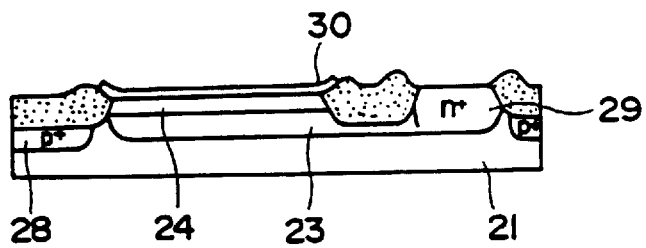
Figure 4F:
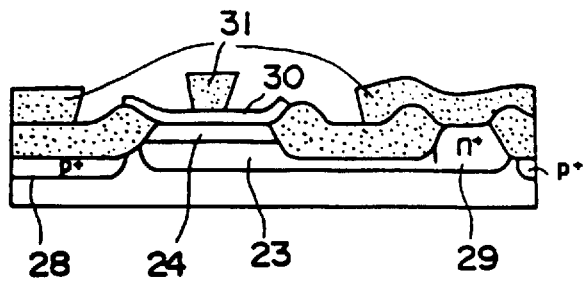

Subsequently, the $Si_3N_4$ film 26 used as a mask for the selective oxidation is removed, and phosphorus is diffused in a collector extraction region as indicated by reference numeral 29 in FIG. 4(e).

After a heat treatment is performed to activate the phosphorus-diffused layer, the $SiO_2$ layer 25 is etched until the Si surface of the epitaxial layer 24 is exposed. A material such as $HF:H_2O=1:100$ may be used as an etchant.

The resultant wafer is conveyed into an RF-DC coupled bias sputtering apparatus, and a 100-Å thick $p^+$-type Si film is formed on the wafer. Subsequently, patterning is performed as shown in FIG. 4(e) by a photoresist process. The $p^+$-type Si film 30 thus formed serves as a base layer. Note that the film formation conditions of the $p^+$-type Si film 30 are, for example, as follows.

That is, polycrystalline Si doped with $1 \times 10^{19}$ to $1 \times 10^{20}$ cm$^{-3}$ of B (boron) is used as a target, and the wafer is conveyed into a chamber. A DC bias of −25 V and RF power of 5 W having a frequency of 100 MHz are applied to the target side, and a DC bias of +7 V is applied to the wafer side. As a result, the wafer surface is cleaned, i.e., an impurity on the wafer surface is removed without causing any damage to the wafer itself. Ar gas, for example, is used as a plasma generation gas, and the Ar pressure is set at, e.g., 8 m Torr.

After the cleaning, the DC bias and the RF power on the target side, for example, are increased to −200 V and 40 W, respectively, and the surface voltage on the wafer side is set at 5 to 10 V. The wafer temperature may be set at 300° C. to 400° C.

Subsequently, the wafer having the patterned base thin film 30 is conveyed into an atmospheric CVD apparatus, and a nondoped $SiO_2$ layer is formed. A resist mask is used to perform patterning by the RIE to obtain an inversely tapered shape as indicated by reference numeral 31 in FIG. 4(f). The inversely tapered $SiO_2$ layer 31 is caused to remain on a prospective formation portion of the emitter, on the field oxide film, and on the collector extraction region 29. The film formation temperature of $SiO_2$ in the atmospheric CVD may be set at, e.g., 300° C. to 400° C.

The resist used in the patterning of the $SiO_2$ layer 31 is removed by $H_2SO_4:H_2O_2=4:1$, and the wafer is washed with water. Thereafter, the natural oxide film formed on the base thin film surface is removed by an etchant $HF:H_2O=1:100$, and the resultant wafer is subjected to washing with water and $N_2$ blow-drying.

Figure 4G:
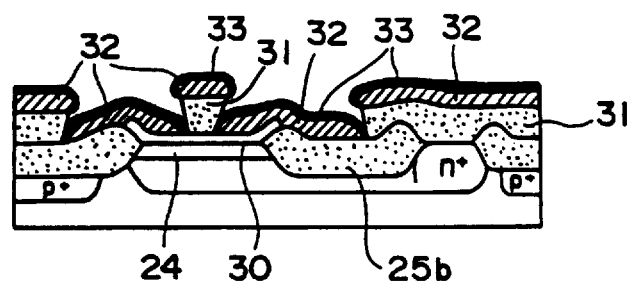

Subsequently, formation of a conductive material is performed. That is, the wafer is conveyed into the RF-CD coupled bias sputtering apparatus. The target is changed to a conductive material such as Al, and a conductive material (Al film) 32 is formed to have a thickness of 2,000 to 4,000 Å, as shown in FIG. 4(g). The film formation conditions are, for example, as follows. That is, after Ar gas at 3 mm Torr is supplied into the chamber, a DC bias of −25 V and RF power of 5 W having a frequency of 100 MHz are applied to the Al target side, and a DC bias of +7 V is applied to the wafer side. The wafer is left to stand for five minutes to clean its surface. Thereafter, the bias and the RF power on the target side are increased to −200 V and 80 W, respectively, and the surface potential on the wafer side is set at 0 to −20 V. The substrate temperature is set at, e.g., room temperature. When film formation is performed under the above conditions, conductive material grains (Al grains) sputtered from the target do not adhere on side wall portions of the CVD $SiO_2$ film 31 but form a film on only the base thin film 30, the field oxide film, and the CVD $SiO_2$ film 31. This film formation is achieved by ① setting film formation conditions such that the degree of migration (surface diffusion) on the wafer surface is reduced or ② forming the CVD $SiO_2$ film 31 into an inversely tapered shape. The film formation conditions of reducing the migration degree described in item ① above are achieved by decreasing the wafer temperature and the energy of Al grains bombarded on the wafer (more specifically, decreasing the DC bias voltage applied on the wafer). To reduce a variation in energy of the bombarded Al grains, the frequency is preferably set at 100 MHz or more. Note that since practical conditions change in accordance with individual situations, film formation conditions under which the migration degree is decreased may be predetermined by an experiment or the like.

After the formation of the CVD $SiO_2$ film 31, in order to form an insulating layer on the surface of the Al film 32, the wafer is conveyed in a vacuum into a chamber, and $F_2$ gas, for example, is supplied into the chamber to form an insulating layer (AlF film) 33 having a thickness of about 1,000 Å on the surface of the Al layer 32.

In the formation of the insulating layer 33, $O_2$ gas may be used to form $Al_2O_3$ (alumina) on the Al surface in place of fluoridization caused by $F_2$ gas.

Figure 4H:
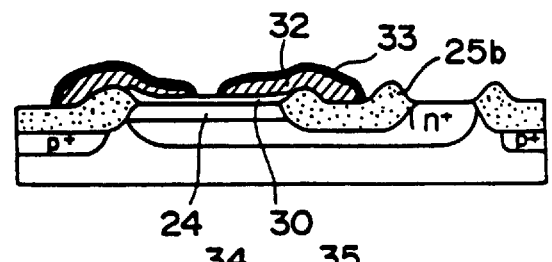

Subsequently, when HF gas is supplied into the chamber, the CVD $SiO_2$ film 31 is selectively removed by this HF gas. In this case, if the wafer is set to face downward, the Al film 32 formed on the surface of the CVD $SiO_2$ film 31 and the insulating layer 33 formed on the surface of the Al film 32 automatically fall by gravity upon removal of the CVD $SiO_2$ film 31. As a result, a structure as shown in FIG. 4(h) is obtained. A space for recovering the falling object consisting of the Al film 32 and the insulating layer 33 formed on the surface of the Al film 32 may be provided on the bottom surface of the chamber via a gate valve. In this case, the gate valve is kept open when the falling object is present. After the HF gas treatment is performed, the gate valve is closed to leak the recovery space to discharge the falling object consisting of the Al film 32 and the insulating layer 33 on the surface of the Al film 32 out of the chamber. The interior of the chamber is always kept clean by this manipulation.

Since the field oxide film 25b consists of $SiO_2$ formed by thermal oxidation, the field oxide film 25b is not etched at all by diluting HF gas by $N_2$ gas to be about 0.1 to several vol %.

With this process, patterning can be performed by a so-called lift-off in the chamber.

At the same time as or after the HF gas etching is performed, an Xe lamp or a UV lamp is preferably turned on to illuminate the wafer surface for the following reason. That is, when the HF gas treatment is performed, although F may partially remain on the wafer surface to produce defects in an emitter thin film formed in the subsequent step, the illumination of the Xe or UV lamp can prevent the production of defects.

If the CVD $SiO_2$ 31 consists of PSG, a residue of a compound $P_2F_5$ is produced on the Si surface (the surface of the base thin film 30) when the HF etching is performed. However, when several % of $Cl_2$ gas are mixed in HF gas diluted by $N_2$ gas described above, it is possible to remove P in the form of $PCl_3$.

In the above embodiment, the removal of $SiO_2$ formed by a CVD apparatus of $HF-N_2-Cl_2$ gas type is described. However, the above selectivity can be obtained by supplying $ClF_2$ gas upon radiation of UV light.

Subsequently, the resultant wafer is conveyed to the DC coupled bias sputtering apparatus through an $N_2$ tunnel or a vacuum tunnel.

The target of the RF-DC coupled bias sputtering apparatus is changed to n-type Si, and a 100-Å thick n-type Si thin film 34 is formed. Note that cleaning may be performed using an H plasma upon film formation. An impurity concentration in the n-type Si thin film 34 may be set at $10^{16}$ to $10^{18}$ $cm^{-3}$. As the film formation conditions, the same bias and RF power as those of the base thin film formation are set.

Figure 4I:
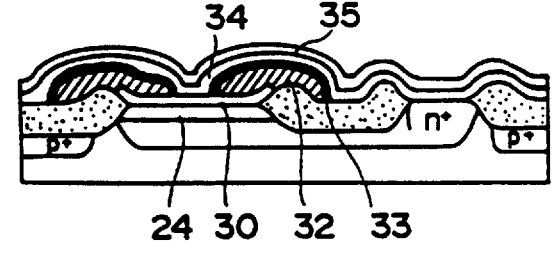
Figure 4J:
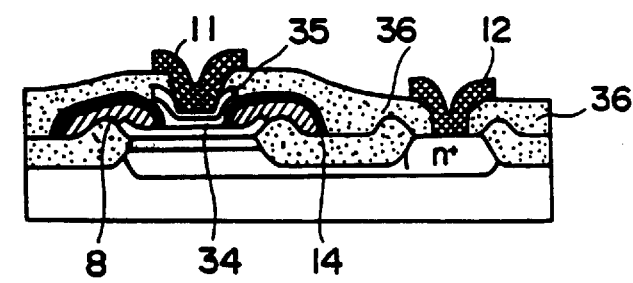

In this embodiment, the target material is further changed to $n^+$-type $Si_xC_yGe_z$ (preferably, x=0.475, y=0.475, and z=0.05), and an $n^+$-type semiconductor material having a wide band gap is formed to have a film thickness of 2,000 Å, as indicated by reference numeral 35 in FIG. 4(i). This thin film 35 serves as a hetero emitter. When the values of the above x, y, and z are set at predetermined values, a good single-crystal $Si_xC_yGe_z$ thin film can be formed since matching in lattice constant with respect to Si of the n-type Si thin film 34 is obtained.

After the formation of the emitter thin films 34 and 35, the emitter thin films 34 and 35 are patterned as shown in FIG. 4(h), and a resist used in the patterning is removed. Thereafter, the resultant wafer is conveyed to the atmospheric CVD apparatus to form an insulating interlayer 36. After formation of the insulating interlayer 36, a contact hole is formed, and a film of a wiring material is formed by the RF-DC coupled bias sputtering and patterned. Finally, a passivation $Si_3N_4$ film is formed on the resultant structure by a plasma CVD apparatus.

As is apparent from the above description, (1) A wafer is not exposed to the outer air from the base electrode metal formation step to the emitter thin film formation step, and a base surface is cleaned by light radiation and a predetermined gas. Therefore, neither a natural oxide film nor other impurities are present on an emitter.base interface.

(2) Since an Si surface of a prospective emitter formation portion is protected by $SiO_2$ before formation of an emitter and is not exposed to a dry etching atmosphere, no damage is caused in the portion.

(3) In the above process, micropatterning of an emitter can be performed because an emitter size is determined by the edge of a base electrode metal.

Although element isolation is performed by the LOCOS in the above embodiment, various types of methods such as trench type element isolation and V-trench type element isolation can be performed as well as the above isolation technique.

The above embodiment is described by taking a hetero bipolar transistor using a material having a large band width as an example, but the present invention is not limited to this embodiment. For example, the present invention may be applied to an arrangement in which an $Si_xGe_{1-x}$ (0<x<1) thin film is used as the base layer 30 and n-type and $n^+$-type Si thin films are used as the emitter thin films 34 and 35, respectively, or an arrangement in which a superlattice thin film of Si and $Si_xGe_{1-x}$ (0<x<1) is used as the base layer.

(2nd Embodiment)

Figure 5:
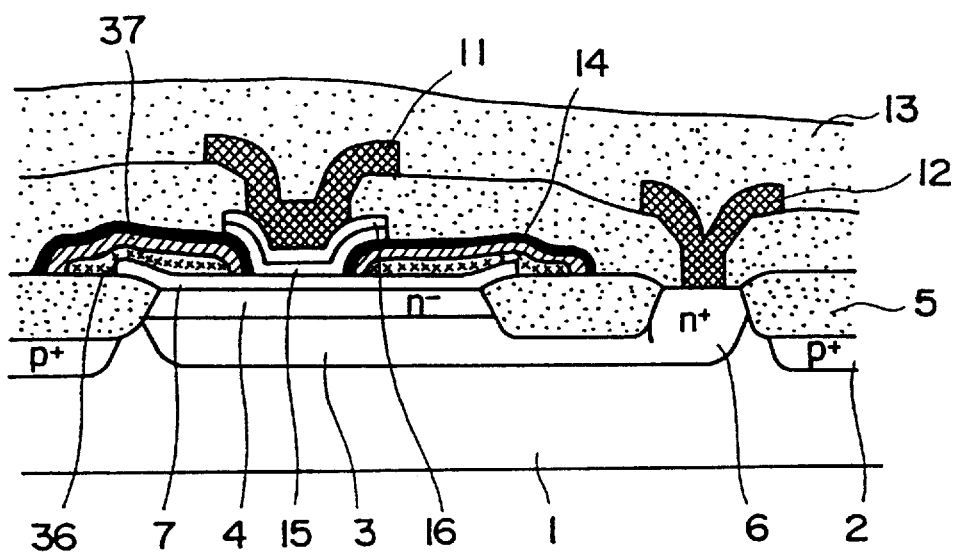
FIG. 5 is a sectional view showing a bipolar transistor according to the second embodiment of the present invention.

The second embodiment of the present invention will be described below with reference to FIG. 5. In FIG. 5, the same reference numerals as in the first embodiment denote the same parts and a detailed description thereof will be omitted.

The second embodiment differs from the first embodiment in that conductive materials 36 and 37 for burying a base electrode consist of a plurality of conductive materials and the conductive material 36 in contact with the base layer 7 has a low Schottky barrier with respect to a p-type Si layer. Preferable examples of the metal having a lower Schottky barrier height with respect to the p-type Si layer are Mo (molybdenum) and W (tungsten). The material 37 may be a wiring metal such as Al.

The structure of the second embodiment can be easily realized by using the above metal target as a target of an RF-DC coupled bias sputtering apparatus of the second embodiment to continuously form films.

With the arrangement of the second embodiment, a contact resistance with respect to a base layer is further decreased to advantageously decrease an external base resistance. When the transistor of this embodiment is of a pnp type, a metal having a low Schottky barrier height with respect to n-type Si or its silicide, e.g., Ti, Ni, $TaSi_2$, or $TiSi_2$ can be used as the material of the metal 36.

(3rd Embodiment)

Figure 6:
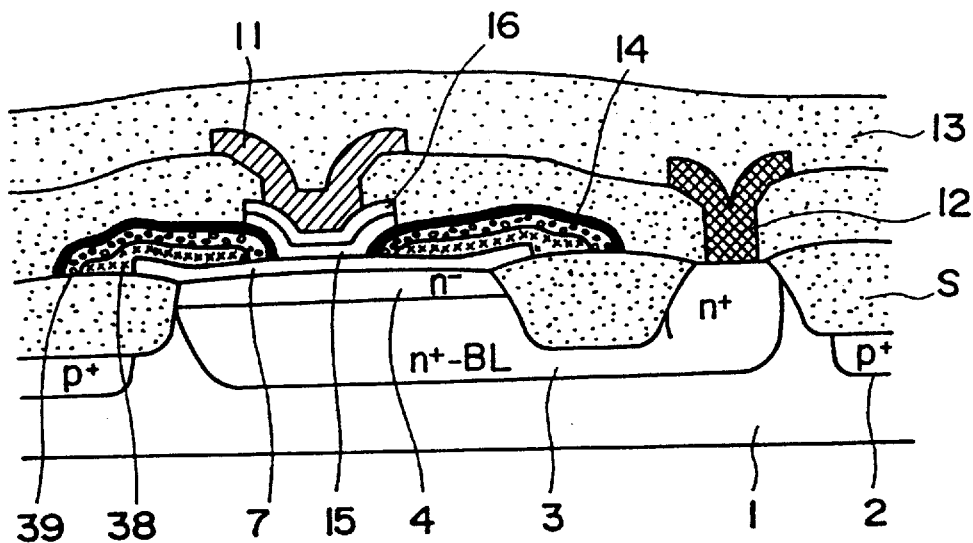
FIG. 6 is a sectional view showing a bipolar transistor according to the third embodiment of the present invention.

The third embodiment of the present invention will be described below with reference to FIG. 6. In FIG. 6, as is the case with the second embodiment, the same reference numerals as in the first embodiment denote the same parts and a detailed description thereof will be omitted.

The third embodiment is identical to the second embodiment in that a conductive material for burying a base electrode consists of at least two types of materials but differs therefrom in that a conductive material 38 in contact with a base layer consists of a metal which is nonreactive to a semiconductor while a conductive material 39 on the surface side allows easy formation of an insulating layer free from pin holes and having a small permittivity by a fluoridization or oxidation treatment. Preferable examples of the metal nonreactive to a semiconductor are W and Ti. Preferable examples of the metal capable of forming a good insulating layer on the surface in accordance with the type of gas atmosphere are Ni, Cr, and Fe. In the formation of an insulating layer, the material is not particularly limited to a metal but may be, e.g., a silicide capable of forming a good insulating layer in an oxygen atmosphere.

The base of the transistor of this embodiment has a very small thickness of about 100 Å. Therefore, when a metal in contact with a base layer contacts a collector layer upon punchthrough in a semiconductor layer, a base-collector leakage current is increased. In addition, if pin holes or the like are present in an insulating layer on the surface of a base buried electrode, an emitter-base leakage current is increased. The arrangement of the third embodiment completely solves the above problems and realizes a highly reliable transistor.

The second and third embodiments are related to the structure of a buried base electrode, but an arrangement of a combination of the second and third embodiments is also possible. An example of the possible arrangement is a structure in which a conductive material in contact with the surface of a base layer has a low Schottky barrier height with respect to a base layer semiconductor while a conductive material on the surface side allows formation of a good insulating layer in a gas atmosphere.

(4th Embodiment)

The fourth embodiment of the present invention will be described below with reference to FIG. 7.

Figure 7:
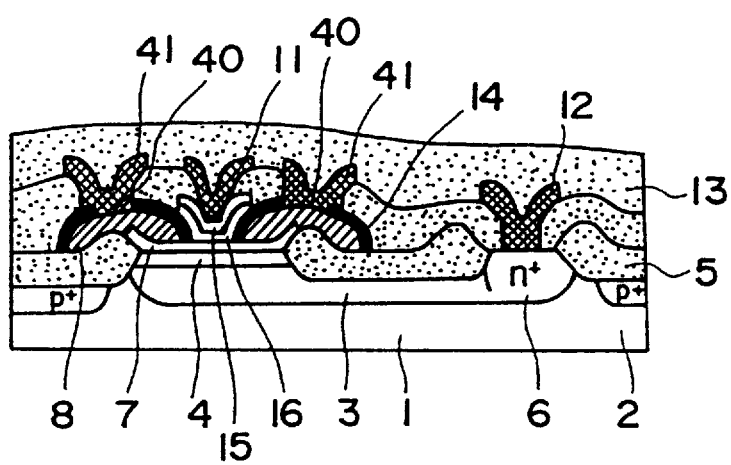
FIG. 7 is a sectional view showing a bipolar transistor according to the fourth embodiment of the present invention.

FIG. 7 is a sectional view showing a bipolar transistor according to the fourth embodiment, in which the same reference numerals as in the first embodiment denote the same parts and a detailed description thereof will be omitted.

The fourth embodiment differs from the first embodiment in that base electrode wiring is extracted from a position close to an emitter. As shown in FIG. 7, therefore, a region 40 where no insulating layer 14 is formed is present on a base buried electrode 8, and a base contact electrode 41 is in contact with the buried electrode 8 via the region 40. In the arrangement of the fourth embodiment, the base buried electrode 8 and the base electrode electrode 41 contact each other not through an impurity diffusion layer (corresponding to 9 in FIG. 3) formed on the surface of a semiconductor substrate but directly. Therefore, an external base resistance can be further reduced to improve frequency characteristics.

A method of manufacturing the bipolar transistor according to the fourth embodiment will be described below with reference to FIG. 8. Since the device manufacturing steps of the fourth embodiment are identical to those of the first embodiment till the step shown in FIG. 2(e) of the first embodiment, only the subsequent steps will be described. In FIG. 8, the same reference numerals as in the first embodiment denote the same parts and a detailed description thereof will be omitted.

As shown in FIG. 8(f'), a base thin film 30 is formed and patterned, and the resultant wafer is conveyed into an atmospheric CVD apparatus to form an impurity-doped $SiO_2$ film. Note that P (phosphorus), B (boron), or a mixture thereof can be used as the impurity. Subsequently, a resist mask is used to perform patterning by RIE so that an inversely tapered shape 42 is obtained, as shown in FIG. 8(f). The impurity-doped $SiO_2$ pattern is the same as in the first embodiment.

The resist used in the $SiO_2$ patterning is removed in an $H_2SO_4:H_2O_2=4:1$ solution, and the resultant structure is washed with water. Thereafter, a natural oxide film formed on the surface of a base thin film is removed by an etchant of $HF:H_2O =1:100$, and the resultant wafer is washed with water, subjected to $N_2$ blow-drying, and conveyed to the RF-DC coupled bias sputtering apparatus. As in the first embodiment, a base electrode 32 to be buried is formed, as shown in FIG. 8(g'). In this film formation, formation of the metal film of the electrode 32 on the side walls of the impurity-doped $SiO_2$ 42 can be prevented by setting the voltage of bias sputtering on the wafer side at a predetermined value. For example, when a target bias is –200 V, RF power having a frequency of 100 MHz to be applied to the target side is 80 W and an Ar gas pressure is 3 mm Torr, the voltage on the wafer side may be set at –20 to 0 V. The conditions are not limited to the above conditions but the energy of ions to be incident on the wafer need only be equal to that in the above conditions. After formation of the base electrode wafer buried layer 32, the wafer is conveyed from the RF-DC coupled bias sputtering apparatus into the atmospheric CVD apparatus to form a non-impurity-doped $SiO_2$ film.

Subsequently, as indicated by reference numeral 43 in FIG. 8(g'), the non-impurity-doped $SiO_2$ is left on only the base electrode buried layer 32 as a prospective base wiring electrode formation region. After the patterning, the resultant wafer is conveyed into an insulating layer formation treatment apparatus, and an insulating layer 44 is formed on the surface of the base electrode buried layer 32, as in the first embodiment. In this insulation layer formation, no insulating layer 44 is formed on the prospective base wiring electrode formation region since the non-impurity-doped $SiO_2$ 43 is formed thereon.

Subsequently, $Cl_2$ gas-added HF gas diluted by $N_2$ gas is supplied into the apparatus. The dilution amount is set to obtain selectivity by which the impurity-doped $SiO_2$ is etched but the non-doped $SiO_2$ is not etched. With this etching gas, only the impurity-doped $SiO_2$ can be removed, as shown in FIG. 8(h'). Since the wafer is set to face downward as described in the above embodiment, the metal on the surface side is simultaneously removed. After the above step, as in the first embodiment, light is radiated or Cl gas is supplied to remove F or the like remaining on the wafer surface, thereby cleaning the wafer surface.

The resultant wafer is conveyed to the RF-DC coupled bias sputtering apparatus through a vacuum tunnel. Thereafter, as shown in FIG. 8(i'), a 100-Å thick n-type Si thin film 34 and an $n^+$-type wide band gap material having a thickness of 2,000 Å are formed.

After the above emitter thin film formation, the emitter thin films 34 and 35 are patterned as shown in FIG. 8(h') as in the first embodiment, and an insulating interlayer 36 is formed by the atmospheric CVD apparatus. It is assumed that this insulating interlayer has RIE characteristics equal to or close to those of the non-doped $SiO_2$ 43. After formation of the insulating interlayer 36, emitter, base, and collector contact holes are formed by RIE. In this case, since the non-doped $SiO_2$ 43 having the etching characteristics similar to those of the insulating interlayer is formed on the buried base electrode, a shape as indicated by reference numeral 45 in FIG. 8(h') is obtained. After formation of the contact holes, a wiring metal film is formed and patterned, and a passivation film is formed, thereby completing the transistor.

The structure of the fourth embodiment can be manufactured by using the selective etching characteristic difference between the non-doped $SiO_2$ and the doped $SiO_2$ in the HF gas etching.

(5th Embodiment)

The fifth embodiment of the present invention will be described below with reference to FIG. 9.

Figure 9:
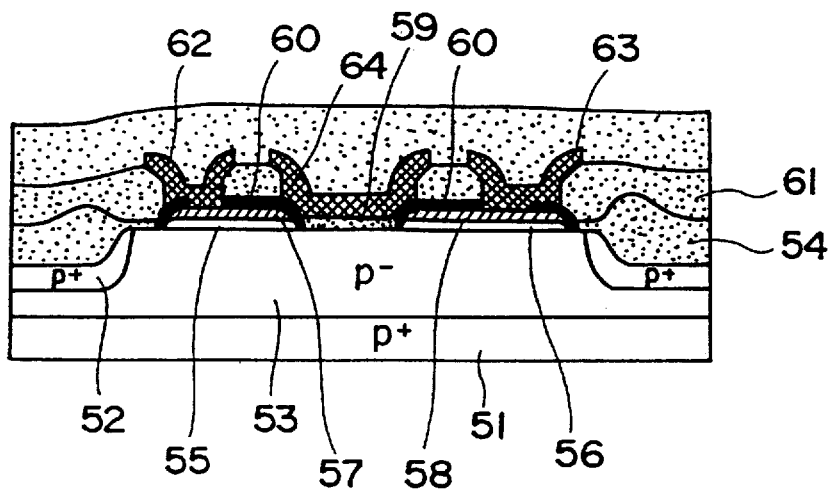
FIG. 9 is a sectional view showing a MOSFET according to the fifth embodiment of the present invention.

FIG. 9 is a sectional view showing a MOSFET manufactured using the present invention. Referring to FIG. 9, reference numeral 51 denotes a $p^+$-type semiconductor buried layer for obtaining a substrate potential; 52, a $p^+$-type semiconductor layer for channel stop of an n-type MOSFET; 53, a p-type well layer; 54, a field oxide film; 55 and 56, source and drain regions consisting of $n^+$-type semiconductor layers, respectively; 57 and 58, conductive material layers (consisting of, e.g., a metal or a low-resistance material similar to the metal, such as a silicide) formed on upper portions of the source and drain regions, respectively; 59, a gate oxide film; 60, an insulating layer formed on the surfaces of the conductive materials 57 and 58; 61, an insulating interlayer which is formed by a CVD apparatus and may consist of, e.g., BPSG (Boron-doped Phospho Silicate Glass), PSG (Phospho Silicate Glass), or NSG (Non-doped Silicate Glass); 62 and 63, wiring electrodes for the source and drain regions 55 and 56, respectively; and 64, a gate electrode.

The characteristics of the MOSFET having the above structure are as follows.

(1) Since the interface between the semiconductor layers, i.e., the source and drain regions 55 and 56 and the underlying semiconductor 53 and that between the gate oxide film 59 and the underlying semiconductor 53 are on the same plane, a short channel effect caused by micropatterning can be suppressed.

(2) The metal portions (conductive materials) 57 and 58 are formed on the upper portions of the source and drain regions, respectively. Therefore, a source-drain parasitic resistance can be largely reduced to suppress a reduction in drain current caused by micropatterning or degradation in gm.

(3) Although the gate electrode is formed at the end of the process, it can be micropatterned since the gate electrode formation step is a self-align step.

(4) Since the gate electrode formation step is performed in the final stage of the process, a degree of freedom in selection of the gate electrode material is increased. For example, a metal gate can be formed.

Although the fifth embodiment is described above by taking an n-channel MOSFET as an example, the present invention can be similarly applied to a p-channel MOSFET.

A method of manufacturing the MOSFET of the fifth embodiment of the present invention will be described below with reference to FIG. 10.

Figure 10A:
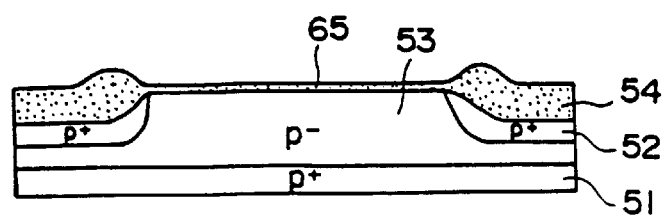
FIG. 10 is a view showing manufacturing steps of the MOSFET according to the fifth embodiment of the present invention.
Figure 10B:
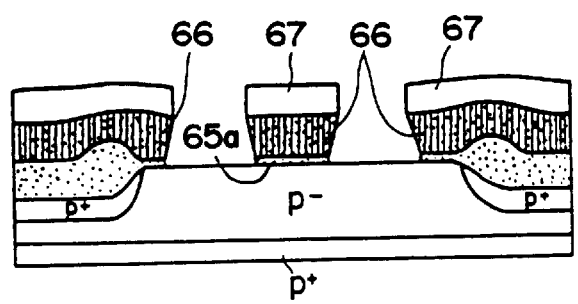

FIG. 10(a) shows a stage in which a field oxide film 54 is formed by a LOCOS technique, the surface of Si on an active region is exposed and sufficiently cleaned by RCA washing, and a 50-Å thick oxide film 65 is formed by thermal oxidation.

Subsequently, the resultant wafer is conveyed into an atmospheric CVD apparatus, and impurity-doped $SiO_2$ is formed and etched by RIE using a resist 67 as a mask to have an inversely tapered shape 66, as shown in FIG. 10(j). The etching is performed until an underlying Si layer (p-type well layer) 53 is exposed. Since the upper surface of an oxide film 65a is covered with the $SiO_2$ layer 66, this surface is not contaminated with an impurity derived from a resist residue.

Figure 10C:
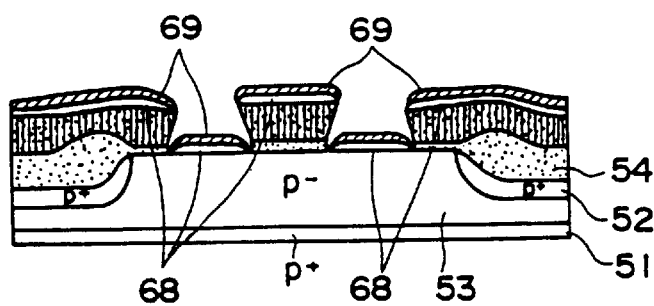

After the etching, the resist is removed by an $H_2SO_4:H_2O_2=4:1$ solution, and the resultant structure is washed with water. Subsequently, a natural oxide film formed on the surface of the p-type well layer 53 is removed by dilute fluoric acid, and the wafer is washed with water and dried by $N_2$ blow. As shown in FIG. 10(c), the resultant wafer is conveyed into an RF-DC coupled bias sputtering apparatus to form a 200-Å thick $n^+$-type Si layer 68 and a 1,000-Å thick Al layer (conductive material layer) 69. The film formation conditions of the two layers are the same as those in the first embodiment and therefore a detailed description thereof will be omitted. As in the first embodiment, since the impurity-doped $SiO_2$ layer 66 has an inversely tapered shape and the surface migration of the Si layer 53 and the Al layer 69 on the substrate surface is low due to a low film formation temperature, no films are formed on the side walls of the $SiO_2$ layer 66.

Figure 10D:
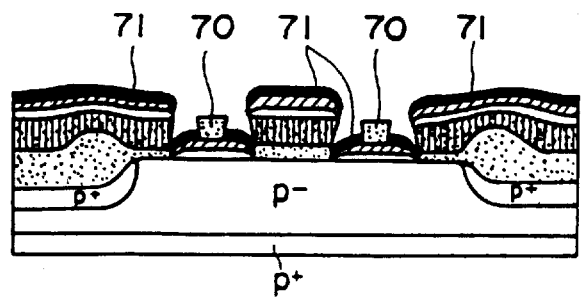
Figure 10E:
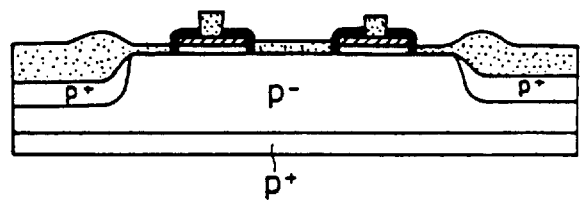

The resultant wafer is removed from the sputtering apparatus, and non-doped $SiO_2$ is formed on a portion of the Al layer 69 formed on the surfaces of the source and drain portions, as indicated by reference numeral 70 in FIG. 10(d). Thereafter, the resultant wafer is conveyed into an insulating layer formation treatment apparatus to form an insulating layer 71 on the surface of the Al layer 69. The formation of the insulating layer 71 may be performed by using, e.g., $F_2$ gas or $O_2$ gas as in the first embodiment. Subsequently, HF gas diluted by $N_2$ gas is supplied into the chamber. As in the other embodiments, since the wafer is set to face downward, the metal or the like on the doped $SiO_2$ falls down. In this case, a dilution amount is set to obtain selectivity by which the impurity-doped $SiO_2$ is etched and the non-impurity-doped $SiO_2$ is not etched. As shown in FIG. 10(e), the impurity-doped $SiO_2$ portion is removed by this etching gas.

Figure 10F:
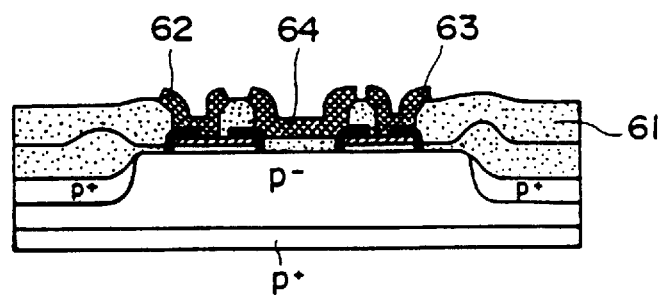

Subsequently, an insulating interlayer 61 is formed by the atmospheric CVD apparatus, contact holes are formed in the source, gate, and drain portions, and a wiring electrode is formed as shown in FIG. 10(f).

Although the most standard LOCOS (Local Oxidation of Silicon) technique is used in element isolation in the fifth embodiment, another method such as drain element isolation or V-trench element isolation may be performed.

In the fifth embodiment, the metal formed on the upper portions of the source and drain portions consists of only one type of metal. As in the second and third embodiments, however, a metal having a low Schottky barrier height with respect to the lower semiconductor or nonreactive to the lower semiconductor can be effectively used as the underlying metal, and a metal free from pin holes and capable of forming an insulating layer having a low permittivity by an $F_2$ or $O_2$ gas treatment can be effectively used as the metal on the surface side.

(6th Embodiment)

Figure 11:
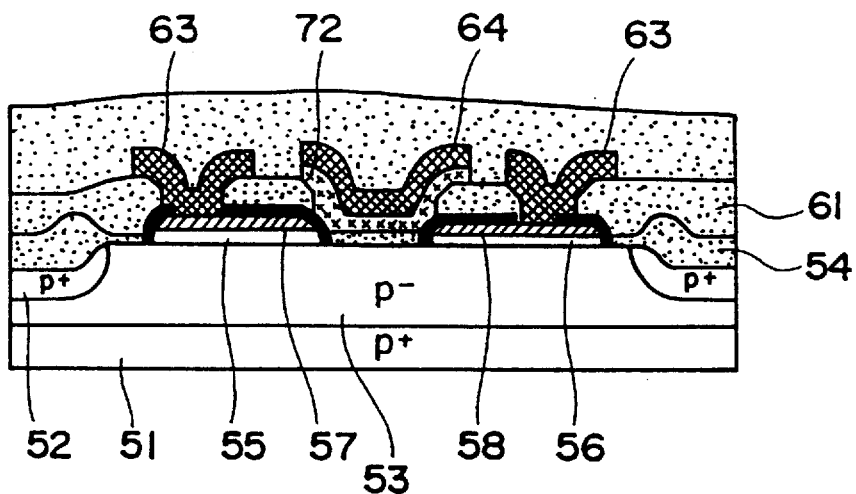
FIG. 11 is a sectional view showing a MOSFET according to the sixth embodiment of the present invention.

The sixth embodiment of the present invention will be described below with reference to FIG. 11. In FIG. 11, the same reference numerals as in the fifth embodiment denote the same parts and a detailed description thereof will be omitted.

Referring to FIG. 11, reference numeral 72 denotes a semiconductor, a silicide, or a metal having a work function capable of obtaining a predetermined threshold value. As is apparent from FIG. 11, in the sixth embodiment, a gate electrode material consists of at least a plurality of materials so that a work function of a material in contact with a gate oxide film can be set at a value capable of obtaining a predetermined threshold value.

(7th Embodiment)

Figure 12:
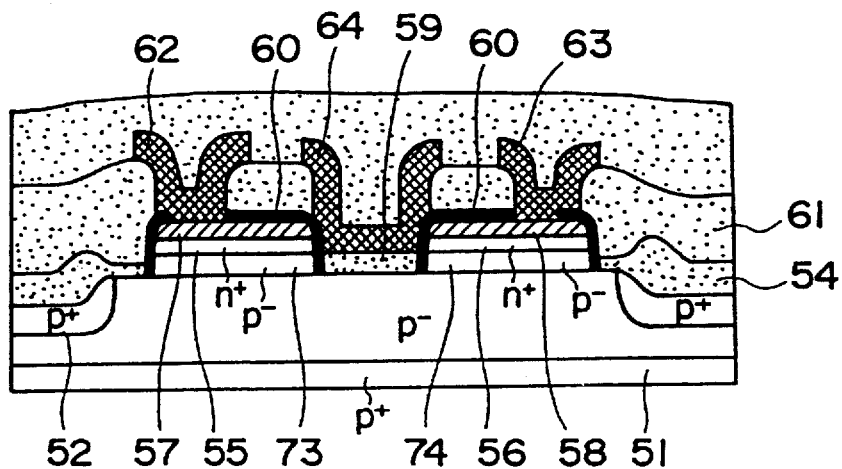
FIG. 12 is a sectional view showing a MOSFET according to the seventh embodiment of the present invention.

The seventh embodiment of the present invention will be described below with reference to FIG. 12. In FIG. 12, the same reference numerals as in the fifth embodiment denote the same parts and a detailed description thereof will be omitted.

Referring to FIG. 12, reference numerals 73 and 74 denote p$^-$-type semiconductor layers present immediately below n$^+$-type semiconductor layers 55 and 56 for forming source and drain regions, respectively.

In a micro MOSFET, if the gate length is decreased to be on the submicron order or less, a short channel effect is caused even in a structure in which source and drain regions and a gate oxide film are formed on the same plane. As a result, a punchthrough current is undesirably flowed through a source-to-drain path.

In the structure of this embodiment, therefore, in order to solve the above problem, the gate oxide film 59 is located closer to the substrate than the source and drain regions 55 and 56. This structure is already reported in "Shigeru Nishimatsu et al. Japanese of Applied Phisics Vol. 16 (1977) Supplement 16-1 pp. 179–183". In the Nishimatsu et al. structure, however, polycrystalline Si is formed on an n$^+$-type layer for forming source and drain regions, and a gate portion is formed by etching an Si substrate to have a trench shape. Therefore, in the Nishimatsu et al. structure, a parasitic resistance in the source and drain regions is high, and the depth of the trench must be controlled by etching, resulting in unsatisfactory manufacturing precision. In contrast to this, in the structure of this embodiment, the conductive material (low-resistance material such as a metal) is formed immediately above the source and drain regions 55 and 56 to decrease the parasitic resistance, and the trench depth of the gate portion can be controlled by the thickness of the p$^-$-type layer immediately below the source and drain regions. As described in the above embodiments, since this film formation is performed by an apparatus capable of performing control at the level of a monoatomic layer such as the RF-DC coupled bias sputtering apparatus, the depth of the trench can be controlled at a high precision.

With this structure, therefore, a micro MOSFET on the submicron order or less is realized.

(8th Embodiment)

The eighth embodiment of the present invention will be described below with reference to FIG. 13. The eighth embodiment relates to an application to a wiring step and, more particularly, to a new technique capable of performing wiring patterning in a vacuum chamber without using a resist step.

Figure 13:
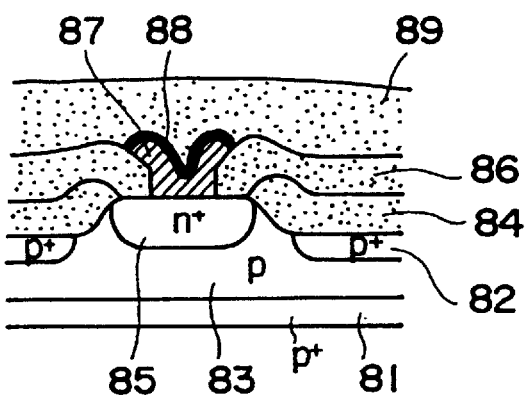
FIG. 13 is a view showing a wiring structure according to the eighth embodiment of the present invention.

FIG. 13 is a sectional view showing wiring manufactured by the process of the present invention. Referring to FIG. 13, reference numeral 81 denotes a p$^+$-type buried layer or p-type semiconductor substrate; 82, an element isolation p$^+$-type semiconductor layer; 83, a p-type well layer; 84, a field oxide film; 85, a semiconductor diffusion layer for obtaining a contact with wiring and consisting of an n$^+$-type semiconductor layer in this embodiment; 86, an insulating interlayer; 87, a wiring metal; 88, an insulating layer formed on the surface of a wiring metal; and 89, a passivation film such as, preferably, an Si$_3$N$_4$ film.

This structure is characterized in that no wiring metal remains between the insulating interlayer 86 and the passivation film 89 except for a wiring portion because no wiring metal adheres on regions except for the wiring formation portion. Therefore, no leakage current flowing through the wiring metal is present in this arrangement of the present invention.

Second, no resist residue caused by wiring metal patterning is present because no resist is used after film formation of the wiring metal as is the case with the first reason.

Third, since the insulating layer is formed on the surface of the wiring metal before the wafer is removed from a chamber (for film formation of a wiring metal), the wiring is not changed but stable in quality.

The wiring step of the eighth embodiment of the present invention will be described below with reference to FIG. 14. In FIG. 14, the same reference numerals as in FIG. 13 denote the same parts and a detailed description thereof will be omitted.

Figure 14A:
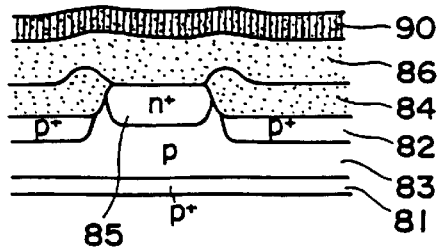
FIG. 14 is a view showing manufacturing steps of the wiring structure according to the eighth embodiment of the present invention.
Figure 15:
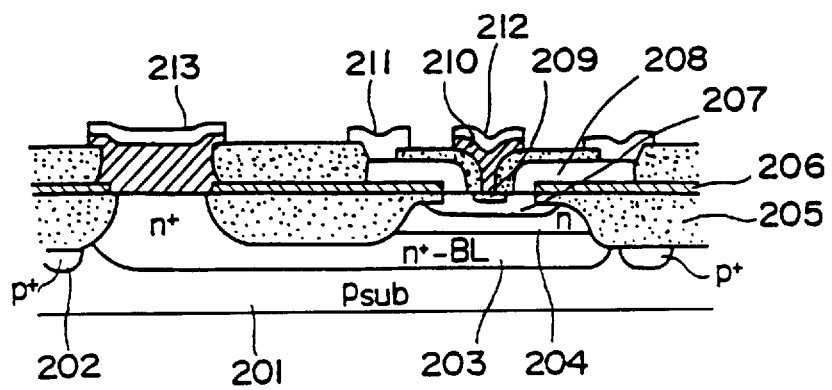
FIG. 15 is a view showing a structure of a conventional high-speed bipolar transistor.
Figure 16:
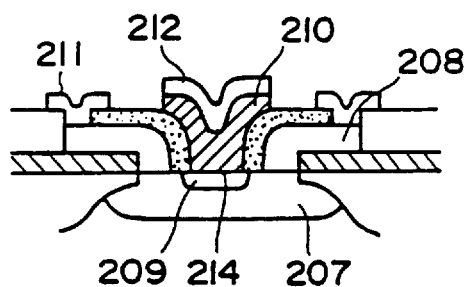
FIG. 16 is an enlarged view showing an emitter portion of the structure of the conventional high-speed bipolar transistor.
Figure 17:
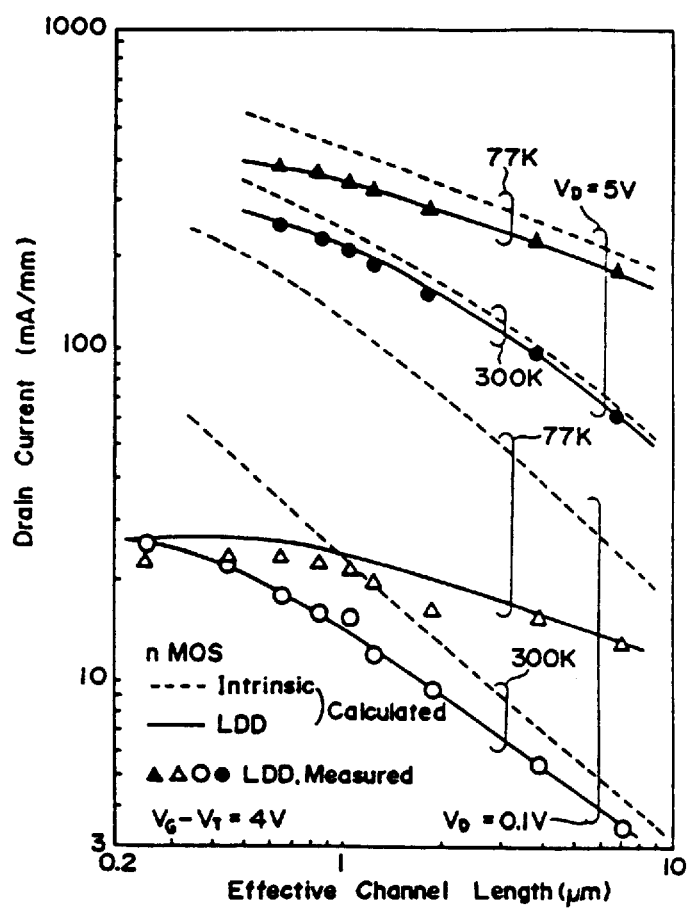
FIG. 17 is a graph showing a change in drain current upon a decrease in channel length of a conventional MOSFET.
Figure 18:
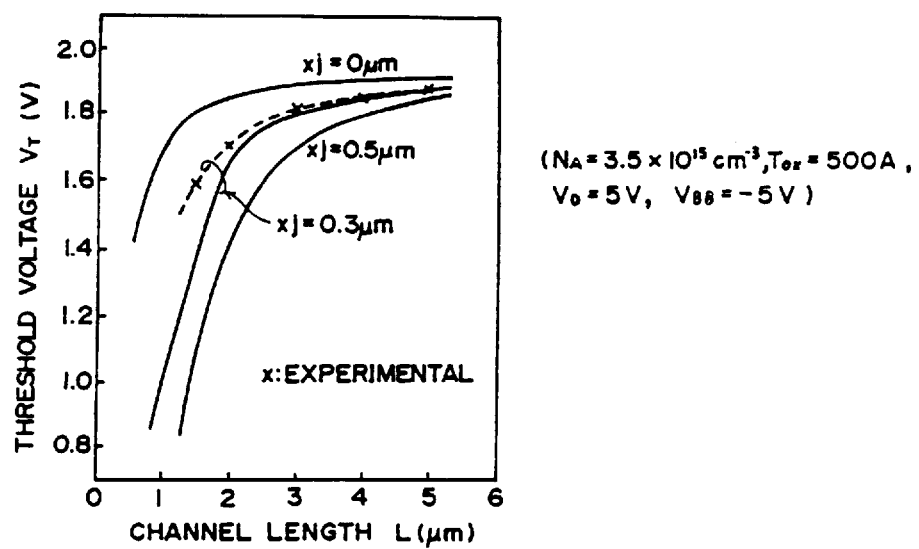
FIG. 18 is a graph showing a change in threshold value upon a decrease in a channel length of the conventional MOSFET.
Figure 19A:
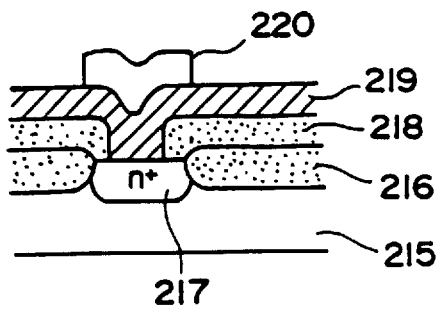
FIG. 19 is a view showing conventional wiring steps.
Figure 19B:
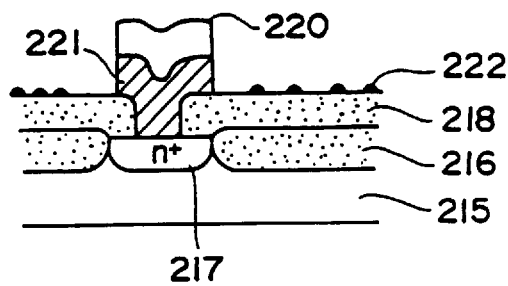
Figure 19C:
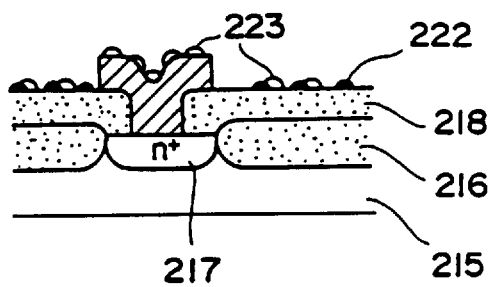

FIG. 14(a) is a sectional view showing a device in a stage in which an insulating interlayer 86 is formed and an impurity-doped SiO$_2$ layer 90 is subsequently formed. In this arrangement, when the insulating interlayer 86 and the SiO$_2$ layer 90 are subjected to etching using HF gas, only the SiO$_2$ layer 90 must be etched. Therefore, it is more preferable to form the insulating interlayer 86 by non-doped SiO$_2$ and perform a heat treatment to obtain dense SiO$_2$ after film formation of the insulating interlayer 86.

Subsequently, a resist pattern having a wiring shape is used to etch only the impurity-doped SiO$_2$ layer 90 first using HF gas (diluted by N$_2$ gas). At this time, the shape of the SiO$_2$ layer 90 in which a contact portion is doped is as indicated by reference numeral 91 in FIG. 14 b1), and the shape of the SiO$_2$ layer 90 in which a wiring portion is doped is as indicated by reference numeral 91 in FIG. 14 b2).

After the above selective etching, the wiring resist pattern is removed, and a resist pattern having a contact hole shape is patterned. The shapes of the resist pattern at the contact portion and the wiring portion are indicated by reference numerals 92 in FIGS. 14 b1) and 14 b2), respectively. The wiring region is covered with the resist as shown FIG. 14 b2), and the contact hole region has an opening portion in the contact hole portion, as shown in FIG. 14 b1). Etching of the insulating interlayer 86 is performed by RIE, and the resist 92 is removed using an H$_2$SO$_4$:H$_2$O$_2$=4:1 solution. The resultant wafer is washed with water, and a natural oxide film formed on the surface of the diffusion layer 85 is removed by dilute fluoric acid. The resultant wafer is washed with water, dried by N$_2$ blow, and conveyed into an RF-DC coupled bias sputtering apparatus to form an Al film 93 under the same conditions as described in the above embodiments. After the film formation, an insulating layer 94 is formed on the Al surface by an F$_2$ or O$_2$ treatment (FIGS. 14 c1) and 14 c2)).

Subsequently, the HF gas etching is performed again to completely remove the impurity-doped SiO$_2$ layer 90, thereby finishing the patterning of the wiring.

In the eighth embodiment, the wiring metal consists of only one type of material. As in the above embodiments, however, the wiring metal may consist of two or more types of materials such that a metal having a low Schottky barrier height is used as a metal in contact with the semiconductor diffusion layer and a metal capable of forming a good insulating layer is used as a metal on the prospective insulating layer formation side.

Industrial Applicability

As has been described above, the advanced technique of the present invention can be widely applied to various steps in a semiconductor process to provide the following effects.

(1) Since film formation of, e.g., a semiconductor and a metal and formation and patterning of an insulating film can all be performed in a vacuum chamber, no natural oxide film is formed on a junction portion, and a semiconductor device which positively uses an interface can be realized with high reliability.

(2) Since a semiconductor region to be used is not exposed to a dry etching atmosphere, no damage is caused in the surface and the interior of the semiconductor.

(3) A self-alignment process enables micropatterning and decreases the number of masks, thereby realizing a very economical device.

(4) In a bipolar transistor, an external base resistance is minimized, and wiring in a base electrode portion need not be formed in a peripheral portion of an emitter, thereby achieving a high operation speed and a very high degree of integration.

(5) In a MOSFET, a parasitic resistance and a parasitic capacitance are minimized to suppress a reduction in drain current or degradation in gm caused by a short channel. In addition, punchthrough caused by the short channel can also be prevented.

(6) Since neither the problem of shallowness of a wiring metal nor that of a resist residue is posed, an insulating layer can be formed on the surface of the wiring metal after the wiring step, thereby improving the reliability of the wiring.

We claim:

1. A method of manufacturing a semiconductor device comprising the steps of:
    providing an inorganic mask on a section on a substrate;
    providing, on a surface of the substrate not covered by the mask, a conductive material different from a material constituting the surface of the substrate, the conductive material comprising aluminum;
    treating a surface of the conductive material with a gas to form an insulative compound film of a material different from the mask, the insulative compound film comprising aluminum fluoride;
    removing the mask from the section; and
    forming, on a section from which the mask is removed, a semiconductor layer, a conductive layer or an insulative layer.

2. A method of manufacturing a semiconductor device comprising the steps of:
    (a) providing an inorganic mask on a section on a substrate, the inorganic mask being arranged adjacent to a surface of the substrate;
    (b) providing, on a surface of the substrate not covered by the mask, a conductive material different from a material constituting the surface of the substrate;
    (c) treating a surface of the conductive material with a gas to form an insulative compound film of a material different from the mask;
    (d) after said step (c), removing the mask from the section; and
    (e) forming on a section from which the mask is removed, a semiconductor layer, a conductive layer or an insulative layer.

3. A method of manufacturing a semiconductor device comprising the steps of:
    forming plural insulating regions partially on the surface of a semiconductor body;
    forming a first semiconductor region on a semiconductor section between the insulating regions, the first semiconductor region having a conductivity type different from that of the semiconductor section;
    forming a mask partially on the first semiconductor region;
    providing a conductive layer on the mask, and on a section not covered by the mask on the first semiconductor region;
    treating a surface of the conductive layer with a gas to form an insulating material layer of a material different from that of the mask;
    removing the mask to expose a part of the first semiconductor region; and
    forming, on the exposed part of the first semiconductor region, a second semiconductor region of a conductivity type opposite to that of the first semiconductor region.

4. A method according to claim 3, wherein the insulating material layer is made of a fluoride.

5. A method according to claim 3 or 4, wherein the conductive layer is made of aluminum.

6. A method according to claim 3, wherein the first semiconductor region operates as a base of a bipolar transistor.

7. A method according to claim 3, wherein the second semiconductor region comprises two layers with different energy bandgaps.

8. A method of manufacturing a semiconductor device comprising the steps of:
    forming a first insulating film on a surface of a semiconductor body;
    forming a mask on the first insulating film;
    etching a part of the first insulating film to expose a part of the semiconductor body;
    depositing on the exposed part of the semiconductor body a conductive material different from a material of the mask;
    treating a surface of the conductive material with a gas to form a second insulating film; and
    removing the mask material to form a pattern of the conductive material connected to the exposed part of the semiconductor body and to the first insulating film.

9. A method according to claim 8, wherein the second insulating film is made of aluminum fluoride.

10. A method of manufacturing a semiconductor device comprising the steps of:
    forming a first insulating film on a semiconductor body;
    forming a mask on the first insulating film;
    removing a portion of the first insulating film not covered by the mask to expose a surface of the semiconductor body;
    forming a semiconductor layer on the exposed surface of the semiconductor body;
    forming a conductive layer on the semiconductor layer;
    treating a surface of the conductive layer with a gas to form a second insulating film of a material different from the conductive layer;
    removing the mask to expose a surface of the first insulating film; and
    forming a gate electrode on the exposed surface of the first insulating film.

11. A method according to claim 10, wherein the second insulating film is made of aluminum fluoride.

12. A method of manufacturing a semiconductor device comprising the steps of:
(a) forming a semiconductor region of a first conductivity type at a surface of a body of a second conductivity type;
(b) providing an inorganic mask on a section on the semiconductor region, the inorganic mask being arranged adjacent to a surface of the semiconductor region;
(c) providing, on a surface of the semiconductor region not covered by the mask, a conductive material different from a material constituting the surface of the substrate;
(d) treating a surface of the conductive material with a gas to form an insulative compound film;
(e) removing the mask from the section; and
(f) forming, at a section from which the mask is removed, a semiconductor layer of the second conductivity type.

13. A method according to claim 12, wherein the insulating material layer is made of a fluoride.

14. A method according to claim 12 or 13, wherein the conductive layer is made of aluminum.

15. A method according to claim 12, wherein the first semiconductor region operates as a base of a bipolar transistor.

16. A method according to claim 3, wherein the insulating regions are formed to lie in physical contact with each other.

17. A method according to claim 13, wherein the conductive material is different from the material constituting the semiconductor regions, and the insulative compound film is different from the material constituting the mask.

18. A method according to claim 12, wherein the semiconductor region operates as a base of a bipolar transistor, and the semiconductor layer of the opposite conductivity type operates as an emitter.

19. A method according to claim 12, wherein the conductive member is aluminum, and the said insulating compound film is aluminum fluoride.

20. A method of manufacturing a semiconductor device having a MOSFET, comprising the steps of:
(a) forming a mask on a portion of a semiconductor which is formed into a channel;
(b) forming source and drain electrodes on a surface of the semiconductor which is not covered with the mask;
(c) performing a reaction with a gas on a surface of said source and drain electrodes, to form an insulating film;
(d) after the step (c), removing the mask, and
(e) forming a gate electrode on the section from which the mask is removed,
wherein said source and drain electrodes are made of metal or silicide.

21. A method according to claim 20, wherein, before said step (b), on the surface of the semiconductor, a semiconductor layer of a conductivity different from that of the semiconductor surface is formed.

22. A method according to claim 20, wherein, before said step (b), on the semiconductor surface, a first semiconductor layer of a higher impurity concentration and the same conductivity type as that of the semiconductor surface, and a second semiconductor layer of a conductivity type opposite to that of the semiconductor surface.

23. A method according to claim 20, wherein, before the step (a), on the semiconductor surface, a thin oxide film is formed.

24. A method according to claim 20, wherein, before the step (c), on a portion of the source and drain electrodes, $SiO_2$ is formed.

25. A method according to claim 20, wherein the source and drain electrodes are made of aluminum, and the insulating film is made of aluminum oxide or aluminum fluoride.

* * * * *